United States Patent [19]

Brown

[11] Patent Number: 5,088,189

[45] Date of Patent: Feb. 18, 1992

[54] ELECTRONIC MANUFACTURING PROCESS

[75] Inventor: John E. Brown, Southington, Ohio

[73] Assignee: Federated Fry Metals, Altoona, Pa.

[21] Appl. No.: 662,459

[22] Filed: Feb. 28, 1991

Related U.S. Application Data

[62] Division of Ser. No. 575,638, Aug. 31, 1990.

[51] Int. Cl.$^5$ .................................................. H05K 3/34
[52] U.S. Cl. ........................................ 29/840; 427/96;
427/386; 523/437; 523/446; 523/448; 523/455;
523/456
[58] Field of Search .................. 427/96, 386; 523/437,
523/446, 448, 455, 456; 29/840

[56] References Cited

U.S. PATENT DOCUMENTS

| | | | |
|---|---|---|---|
| 3,923,571 | 12/1975 | Aoki et al. | 427/146 X |
| 4,532,273 | 7/1985 | Kadowaki et al. | 524/501 X |
| 4,982,892 | 1/1991 | Parla et al. | 29/846 X |
| 4,985,107 | 1/1991 | Conroy et al. | 29/740 X |

*Primary Examiner*—Michael Lusignan
*Attorney, Agent, or Firm*—Kenyon & Kenyon

[57] ABSTRACT

A solder paste flux comprising an epoxy resin, a carboxylic acid, a substantially solid alcohol, cellulose, a catalyst, a solvent for the carboxylic acid and a synthetic resin; a solder paste incorporating this solder paste flux; and a surface mount electronic manufacturing process utilizing the solder paste.

7 Claims, No Drawings

ELECTRONIC MANUFACTURING PROCESS

This application is a division of application Ser. No. 07/575,638, filed Aug. 31, 1990.

FIELD OF THE INVENTION

The present invention relates to an epoxy based solder paste flux, and a solder paste incorporating the flux, particularly advantageous for use in a surface mount electronics manufacturing process. The present invention also relates to surface mount electronics manufacturing process utilizing the epoxy based solder paste.

BACKGROUND

A solder paste is a material that is capable of being applied to a substrate or surface in a specific pattern using screening or analogous methods which can subsequently undergo fusing to provide an electrical joint or interface commonly referred to as a solder joint. Solder pastes generally comprise powdered metallic solders of various alloys such as tin-lead, tin-lead-silver, tin-lead-bismuth, tin-lead-antimony, tin-silver etc. contained in a vehicle including a flux. In addition a suspension medium, such as hydrogenated castor oil, may be present in the vehicle and combined with the flux to provide a solder paste of uniform texture and consistency.

In electronic circuity, solder pastes are employed to secure miniature electronic components to a circuit on a substrate such as ceramic or glass or the like. Circuits, similar to those used on printed circuit boards are produced on the substrates. The areas of the circuit to which electronic components are to be added are commonly referred to as pads. Generally in a typical surface mount electronics manufacturing process, a solder paste is screen or template printed onto the pads of the printed circuit board. Next, the electronic components are carefully positioned with their peripheral contacts in contact with the solder paste coated pads.

When all of the electronic components are in place on the circuit board, the solder paste is caused to reflow. One way the solder paste can be caused to reflow is by passing the board through an infrared belt furnace. The heat generated in the infrared furnace causes the solder paste to reflow thus fusing the electronic components to the circuit board.

Flux residues are also generated by the reflowing of the solder paste. The flux residues are generally corrosive and therefore are generally removed from the circuit board. Typically, the removal of the flux residues is accomplished by washing the printed circuit board in a CFC based solvent.

After the flux residues are removed the circuit board is generally suitable for use. However, to protect the solder joints from the corrosive effects of elements such as moisture and salt air, an epoxy coating may be applied over the solder joints. Generally this epoxy coating is applied in liquid form and then cured to form a clear, hard protective coating.

A problem, as set forth above, with generally utilized solder pastes is that the reflowing of the solder paste creates corrosive flux residues. A related problem is that the removal of flux residues creates a step in the surface mount electronic manufacturing process. Since the removal of the flux residues is generally accomplished by washing the printed circuit board in a CFC (chlorinated-fluorocarbon) based solvent, and CFC solvents present environmental hazards in their use and disposal, the removal of flux residues in addition to creating an extra step, may cause hazardous conditions in the workplace.

A further problem in generally performed surface mount electronic manufacturing processes is that the protective epoxy coating, if desired, must be applied in an additional step.

It would be advantageous in a surface mount electronic manufacturing process to have a solder paste which did not produce corrosive flux residues when reflowed.

It would also be advantageous in a surface mount electronic manufacturing process to have a solder paste which could be cured to form a protective epoxy coating on the solder joints without the need for an additional coating step.

SUMMARY OF THE INVENTION:

The aforementioned problems are overcome, and the aforementioned advantages achieved, by the solder paste flux, solder paste and surface mount electronic manufacturing process of the present invention.

According to the present invention a solder paste flux comprises an epoxy resin, carboxylic acid, a substantially solid alcohol, cellulose, a catalyst, a solvent for the carboxylic acid and a synthetic resin. Preferably the flux comprises:

30%–50%, by weight, an epoxy resin,
7%–15%, by weight, carboxylic acid,
6%–12%, by weight, alcohol,
6%–10%, by weight, cellulose,
0.1%–1.0%, by weight, catalyst,
20%–30%, by weight, solvent for the carboxylic acid, and
1%–5%, by weight, a synthetic resin.

Suitable epoxy resins include, but are not limited to, substantially clear epoxy resins with low hydrolyzable chloride contents, such as liquid bisphenol-A based epoxy resins. Suitable epoxy resins include QUATREX 1010 resin, a trademarked product manufactured and sold by Dow Chemical U.S.A., Midland, Mich. 48674 a liquid bisphenol-A based epoxy resin having a hydrolyzable chloride content of less than 100 parts per million (ppm). Suitable synthetic resins include, but are not limited to, substantially clear, highly oxidation resistant synthetic resins such as thermoplastic acidic resins. Suitable synthetic resins include FORAL® AX resin, a trademarked product of Hercules Incorporated, Wilmington, Del. 19894, and Staybelite® resin a trademarked product of Hercules, Incorporated, Wilmington, Del. 19894. Suitable carboxylic acids include, but are not limited to glutaric acid, suberic acid, dihydroxysuccinic acid, and succinic acid. Suitable cellulose include, but are not limited to hydroxypropylcellulose, hydroxyethylcellulose, methylcellulose and hydroxybutylmethylcellulose. Suitable solvents for the carboxylic acid include, but are not limited to, 1,2 propanediol and polypropylene glycol. Suitable alcohols include, but are not limited to, alcohols which are substantially solid at room temperature (75° F.) such as cetyl alcohol. Suitable catalysts include, but are not limited to, dicyclopentadiene, dicyandiamide, nadicmethylanhydride and methylenedianaline.

Preferably, the solder paste flux of the present invention comprises: QUATREX 1010 resin as the epoxy resin; glutaric acid as the carboxylic acid; cetyl alcohol, as the substantially solid alcohol; cellulose; dicyclopentadiene, as the catalyst; 1,2, propanediol as the solvent for the carboxylic acid; and FORAL ® AX resin as the synthetic resin in the following proportions:
30%–50%, by weight, QUATREX 1010,
7%–15%, by weight, glutaric acid,
6%–12%, by weight, cetyl alcohol,
6%–10%, by weight, cellulose,
0.1%–1.0%, by weight, dicyclopentadiene,
20%–30%, by weight, 1,2 propanediol, and
1%–5%, by weight, FORAL ® AX resin.
Preferably the paste comprises:
35%–45%, by weight, QUATREX 1010,
10%–12%, by weight, glutaric acid,
8%–10%, by weight, cetyl alcohol,
7%–9%, by weight, cellulose,
0.1%–0.5%, by weight, dicyclopentadiene,
25%–30%, by weight, 1,2 propanediol, and
1%–3%, by weight, FORAL ® AX resin.

The flux of the present invention may be produced by dissolving the cellulose, synthetic resin, alcohol and carboxylic acid in the solvent for the carboxylic acid, and then adding the epoxy resin and catalyst and mixing to complete the flux. Generally the completed flux is placed in a sealed container and is let stand for at least approximately 24 hours before use. Since the completed flux is stable, the flux may be stored in a sealed container until combined with a solder powder to produce a solder paste. The process for preparing the novel flux of the present invention will be described in greater detail hereinafter.

The solder paste of the present invention comprises the solder paste flux of the present invention and a solder powder. Suitable solder powders include, but are not limited to tin/lead solder powders, tin/lead/silver solder powders and tin/lead/antimony solder powders. Solder powder is used herein to described the substantially spherical metallic pieces, generally of between 25 and 70 microns in diameter, of the various solder alloys.

More particularly, the solder paste of the present invention comprises a solder powder and a solder paste flux wherein the solder paste flux comprises an epoxy resin, carboxylic acid, an alcohol, cellulose, a catalyst, a solvent for the carboxylic acid and a synthetic resin. Preferably the solder paste includes a solder paste flux which comprises:
30%–50%, by weight, an epoxy resin,
7%–15%, by weight, carboxylic acid,
6%–12%, by weight, alcohol,
6%–10%, by weight, cellulose,
0.1%–1.0%, by weight, catalyst,
20%–30%, by weight, solvent for the carboxylic acid, and
1%–5%, by weight, a synthetic resin.

More preferably, the solder paste of the present invention includes a solder paste flux which comprises: QUATREX 1010 resin as the epoxy resin; glutaric acid as the carboxylic acid; cetyl alcohol, as the alcohol; cellulose; dicyclopentadiene, as the catalyst; 1,2 propanediol as the solvent for the carboxylic acid; and FORAL ® AX resin as the synthetic resin in the following proportions:
30%–50%, by weight, QUATREX 1010,
7%–15%, by weight, glutaric acid,
6%–12%, by weight, cetyl alcohol,
6%–10%, by weight, cellulose,
0.1%–1.0%, by weight, dicyclopentadiene,
20%–30%, by weight, 1,2 propanediol, and
1%–5%, by weight, FORAL ® AX resin.

The solder paste of the present invention may be produced by mixing solder powder with the solder paste flux produced according to the description above.

The surface mount electronic manufacturing process of the present invention comprises the following steps:
1) Applying the solder paste of the present invention onto the pads of a printed circuit board;
2) assembling the electrical components onto the printed circuit board wherein the peripheral contacts of the electronic components are in contact with the solder paste coated pads;
3) heating to printed circuit board to a temperature, and for a period of time, sufficient to cause the solder paste to reflow and the epoxy residue to cure;
4) allowing the printed circuit board to cool.

The resulting printed circuit board has epoxy coated solder joints which are impervious to the effects of corrosive elements such as salt air and moisture. As will be obvious to one of ordinary skill in the art in reviewing the above listed process steps, advantages of the process of the present invention include that the process does not require cleaning flux residues from the printed circuit boards and that the process of the present invention produces epoxy coated solder joints without necessitating a specific step for applying and curing an epoxy resin after the solder paste has been caused to reflow and then allowed to harden.

An advantage of the solder paste flux of the present invention is that the solder paste flux may be combined with solder powder to produce a solder paste which upon reflowing produces minimal flux residues.

Another advantage of the solder paste flux of the present invention is that the solder paste flux may be combined with solder powder to produce a solder paste which upon reflowing and curing will produce epoxy coated solder joints impervious to the corrosive effects of salt air and moisture.

A further advantage of the solder paste flux of the present invention is that the solder paste flux is stable and therefore has a shelf-life of many months, generally at least 3 months.

An advantage of the solder paste of the present invention is that the solder paste produces minimal flux residues when reflowed.

Another advantage of the solder paste of the present invention is that the solder paste produces epoxy coated solder joints upon reflowing and curing.

A further advantage of the solder paste of the present invention is that the solder paste is tacky before reflowing and therefore will hold electrical components in place in a surface mount electronic manufacturing process.

An advantage of the surface mount electronic manufacturing process of the present invention is that the process does not require a cleaning step to remove flux residues after the solder paste has been reflowed, therefore the process will reduce manufacturing coasts by eliminating the need to use and dispose of cleaning solvents such as CFC solvents.

Another advantage of the surface mount electronic manufacturing process of the present invention is that the process produces epoxy coated solder joints.

Other advantages of the present invention will become apparent in the following more detailed description of the invention.

DETAILED DESCRIPTION OF THE INVENTION

The present invention includes a solder paste flux, a solder paste and a surface mount electronic manufacturing process utilizing the solder paste of the present invention.

According to the present invention a solder paste flux comprises an epoxy resin, carboxylic acid, a substantially solid alcohol, cellulose, a catalyst, a solvent for the carboxylic acid and a synthetic resin. Preferably the flux comprises:

30%-50%, by weight, an epoxy resin, preferably QUATREX 1010 resin;
7%-15%, by weight, carboxylic acid, preferably glutaric acid;
6%-12%, by weight, alcohol, preferably cetyl alcohol;
6%-10%, by weight, cellulose;
0.1%-1.0%, by weight, catalyst, preferably dicyclopentadiene;
20%-30%, by weight, solvent for the carboxylic acid, preferably 1,2, propanediol; and
1%-5%, by weight, a synthetic resin preferably FORAL® AX.

Additional epoxy resins, synthetic resins, carboxylic acids, solvents for the carboxylic acid, alcohols, and catalysts, suitable for use in the present invention are described above in the SUMMARY OF THE INVENTION section.

The flux of the present invention may be produced by mixing the cellulose with the solvent for the carboxylic acid until the cellulose is dissolved, dissolving the synthetic resin in the cellulose-propanediol mixture and then dissolving the substantially solid alcohol in the resulting mixture. Next the carboxylic acid is dissolved into the mixture. After the carboxylic acid is dissolved the epoxy resin is added and the mixture is mixed until a smooth homogeneous mixture is realized. The catalyst is then added and the resulting mixture is mixed until the catalyst is throughly dispersed throughout the mixture to complete the flux. Generally the completed flux is placed in a sealed container and is let stand for at least approximately 24 hours before use.

The completed solder paste flux of the present invention is stable and therefore may be stored in a sealed container for up to approximately 3 months before use.

The solder paste of the present invention comprises the solder paste flux of the present invention and a solder powder. Suitable solder powders include, but are not limited to tin/lead solder powders, tin/lead/silver solder powders.

More particularly, the solder paste of the present invention comprises a solder powder and a solder paste flux wherein the solder paste flux comprises an epoxy resin, carboxylic acid, a substantially solid alcohol, cellulose, a catalyst, a solvent for the carboxylic acid and a synthetic resin. Preferably the solder paste includes a solder paste flux which comprises:

30%-50%, by weight, an epoxy resin, preferably QUATREX 1010 resin;
7%-15%, by weight, carboxylic acid, preferably glutaric acid;
6%-12%, by weight, alcohol, preferably cetyl alcohol;
6%-10%, by weight, cellulose;
0.1%-1.0%, by weight, catalyst, preferably dicyclopentadiene;
20%-30%, by weight, solvent for the carboxylic acid, preferably 1,2, propanediol; and
1%-5%, by weight, a synthetic resin preferably FORAL® AX.

Additional epoxy resins, synthetic resins, carboxylic acids, solvents for the carboxylic acid, alcohols, and catalysts, suitable for use in the present invention are described above in the SUMMARY OF THE INVENTION section.

The solder paste of the present invention may be produced by mixing solder powder with the solder paste flux produced according to the description above. More particularly the solder paste of the present invention may be produced by mixing 85-90%, by weight, solder powder with 10-15%, by weight, of the solder paste flux of the present invention.

The mixing may occur in a variety of manners known to those of ordinary skill in the art. For example, the paste flux may be placed in a stainless steel mixing bowl and the bowl placed under a planetary mixer. The mixer may then be started and solder powder slowly added to the mixing bowl, to mix the paste flux and the solder powder. The standard mixing time for solder pastes prepared in this manner is generally about 6 minutes.

The resulting solder paste of the present invention is advantageous for use in the soldering of electrical components, electrical contacts and electrical wires, and particularly advantageous for use to fuse electrical components to a circuit board in a surface mount electronic manufacturing process.

The surface mount electronic manufacturing process of the present invention comprises the following steps:
1) Applying the solder paste of the present invention onto the pads of a printed circuit board;
2) assembling the electrical components onto the printed circuit board wherein the peripheral contacts of the electronic components are in contact with the solder paste coated pads;
3) heating to printed circuit board to a temperature, and for a period of time, sufficient to cause the solder paste to reflow and the epoxy residue to cure;
4) allowing the printed circuit board to cool.

The solder paste may be applied by printing the solder paste onto the pads of the printed circuit board by any of the techniques known to those of ordinary skill in the art. Suitable techniques for printing the solder paste onto the pads of the printed circuit board include silk screening, stenciling and dispensing the solder paste through a syringe. As will be obvious to those of ordinary skill in the art, the solder paste may be applied to the pads of the printed circuit board in a variety of other manners without departing from the process of the present invention. As will also be obvious, the solder paste may be applied to areas of the printed circuit board other than the pads to attach electrical components to areas of the printed circuit board other than the pads.

After the solder paste has been applied to the pads of the printed circuit board the electrical components are assembled onto the printed circuit board, by hand or machine, in a manner that places the electrical contact portions of the electrical components in contact with the solder paste. Since the solder paste of the present invention is tacky before reflowing, the electrical components will be held in place by the solder paste until the solder paste is reflowed.

Next, the solder paste is caused to reflow by heating the printed circuit board, or the solder paste areas of the printed circuit board, to a sufficient temperature, and for a sufficient time to cause the solder paste to reflow.

One method suitable for heating the solder paste, is by moving the printed circuit board through an infrared furnace. Generally the solder paste is heated to about 25° C. above the melting point of the solder alloy for approximately 30 to 100 seconds in order to cause the solder paste to reflow. The heating of the solder paste also starts the epoxy curing process. Thus as the solder paste is cooling, after being reflowed, to a solid, the epoxy portion of the solder paste is curing and coating the solder joints.

The printed circuit board is then allowed to cool. The resulting printed circuit board has epoxy coated solder joints which are impervious to the effects of corrosive elements such as salt air and moisture.

The effectiveness and advantages of the present invention will be further illustrated by the following examples.

EXAMPLE 1

This examples illustrates the preparation of a solder paste flux of the present invention.

1,350 g (grams) of 1,2, propanediol is heated to 100° C.

390 g hydroxypropylcellulose is added to the 1,2, propanediol and the mixture is stirred until the hydroxypropylcellulose is dissolved.

100 g FORAL ® AX resin is added and the mixture is stirred until the FORAL ® AX resin is dissolved.

450 g cetyl alcohol is added to the mixture and the mixture is stirred until the cetyl alcohol is dissolved.

The resulting mixture is then cooled to 60° C.

550 g glutaric acid is added to the mixture and the mixture is stirred until the glutaric acid is dissolved.

2,150 g QUATREX 1010 resin is added to the mixture and the mixture is stirred for 4 minutes.

10 g dicyclopentadiene is added to the mixture and the mixture is stirred for 3 minutes.

The resulting solder paste flux is placed in a sealed contained and let stand for approximately 24 hours before using.

The resulting solder paste flux comprises:
43%, by weight, QUATREX 1010 resin;
11%, by weight, glutaric acid;
9%, by weight, cetyl alcohol;
7.8%, by weight, hydroxypropylcellulose;
0.2%, by weight, dicyclopentadiene;
27%, by weight, 1,2, propanediol; and
2%, by weight, FORAL ® AX.

EXAMPLE 2

This example illustrates a method for preparing the solder paste of the present invention.

45 g of the solder paste flux of Example 1, after storing for at least approximately 24 hours, is added to a vessel.

408 g of a 60/40 tin/lead solder powder is added to the vessel and mixed with the solder paste flux for about six minutes to produce a solder paste of the present invention. It should be clearly understood that the forms of the present invention herein described are illustrative only and are not intended to limit the scope of the invention. Thus, as will be obvious to those of ordinary skill in the art, although the solder paste flux and solder paste of the present invention have been described with reference to a surface mount electronic manufacturing process, the solder paste flux and solder paste may be utilized for a variety of other applications in the place of heretofore known solders and solder fluxes.

I claim:

1. A surface mount electronic manufacturing process comprising the steps of:
   1) applying a solder paste including a solder powder and a solder flux containing an epoxy resin onto pads of a printed circuit board;
   2) assembling electrical components onto the printed circuit board wherein the peripheral contacts of the electronic components are in contact with the solder paste coated pads;
   3) heating the printed circuit board to a temperature, and for a period of time, sufficient to cause the solder paste to reflow and the epoxy residue from the epoxy resin to cure to form a protective coating for the solder joint;
   4) allowing the printed circuit board to cool.

2. The process of claim 1 wherein the solder flux further comprises: an epoxy resin, a carboxylic acid, a substantially solid alcohol, cellulose, a catalyst, a solvent for the carboxylic acid and a synthetic resin.

3. The process of claim 2 wherein the solder paste flux comprises:
   30%-50%, by weight, the epoxy resin,
   7%-15%, by weight, the carboxylic acid,
   6%-12%, by weight, the alcohol,
   6%-10%, by weight, the cellulose,
   0.1%-1.0%, by weight, the catalyst,
   20%-30%, by weight, the solvent for the carboxylic acid, and
   1%-5%, by weight, the synthetic resin.

4. The process of claim 3 wherein the epoxy resin is a substantially clear liquid bisphenol-A based epoxy resin having a hydrolyzable chloride content not greater than about 100 parts per million, the carboxylic acid is selected from the group consisting of glutaric acid, suberic acid, dihydroxysuccinic acid, and succinic acid, the alcohol is an alcohol that is substantially solid at room temperature (75° F.), the cellulose is selected from the group consisting of hydroxypropylcellulose, hydroxyethylcellulose, methylcellulose and hydroxybutylmethylcellulose the catalyst is selected from the group consisting of dicyclopentadiene, dicyandiamide, nadicmethylanhydride and methylenedianalinedicyclopentadiene the solvent is selected from the group consisting of 1,2, propanediol and polypropylene glycol and the synthetic resin is a substantially clear, oxidation resistant thermoplastic acidic resin.

5. The process of claim 2 wherein the solder powder is selected from the group consisting of: tin/lead solder powder, tin/lead/silver solder powder and tin/lead/antimony solder powder.

6. The process of claim 3 wherein the solder powder is selected from the group consisting of: tin/lead solder powder, tin/lead/silver solder powder and tin/lead/antimony solder powder.

7. The process of claim 4 wherein the solder powder is selected from the group consisting of: tin/lead solder powder, tin/lead/silver solder powder and tin/lead/antimony solder powder.

* * * * *